Oct. 23, 1962 R. E. WATSON 3,060,326

AUTOMATIC PULSE AMPLITUDE CONTROL

Filed Dec. 8, 1958

INVENTOR
ROBERT EARL WATSON

BY Robert K. Schumacher
ATTORNEY

United States Patent Office 3,060,326
Patented Oct. 23, 1962

3,060,326
AUTOMATIC PULSE AMPLITUDE CONTROL

Robert Earl Watson, Tulsa, Okla., assignor to Well Surveys Incorporated, a corporation of Delaware Filed Dec. 8, 1958, Ser. No. 778,683
3 Claims. (Cl. 307—88.5)

Figure 1:
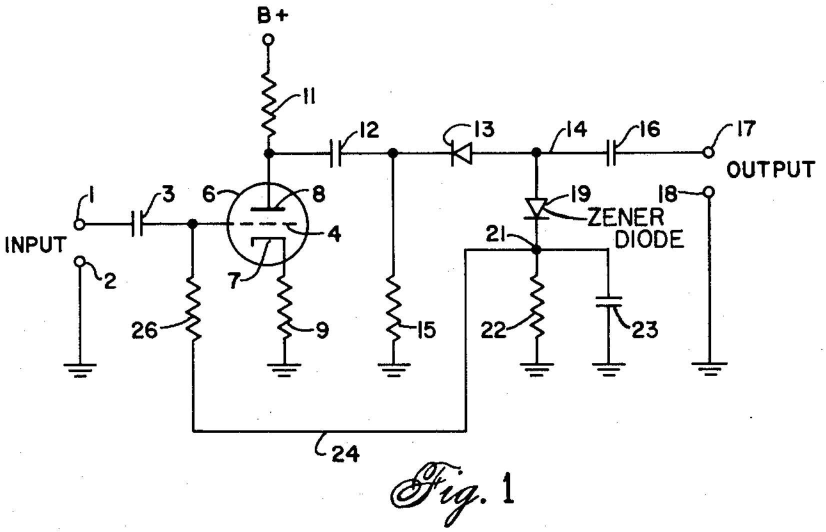

The present invention relates to pulse amplitude control circuits and more particularly to a pulse amplitude control circuit for producing constant amplitude output pulses constituting the upper segment, only, of an amplified input pulse.

In pulse counting and pulse-responsive control circuits, it is desirable to maintain information pulses at a constant amplitude and to reduce the amplitude of noise pulses so as to avoid the possibility of spurious operation in response to marginal noise pulses and of failure of operation in response to marginal information pulses. More specifically, it is advantageous to maintain information-bearing pulses at a fixed amplitude well above the threshold of response of the pulses utilization circuits and to reduce the amplitude of noise signals well below the threshold of response of such circuits.

In accordance with the present invention, a circuit is provided which serves the dual function of maintaining output pulses at a fixed amplitude and of reducing noise voltage so as to improve the signal-to-noise ratio of the system. The two functions of the circuit are achieved by coupling only the uppermost and therefore the more noise free segment of an amplified information pulse to an output lead of the circuit, and by maintaining the amplitude of the pulse appearing on the output lead at a constant amplitude. In order to achieve the objects of the invention, which are set forth more fully below, input pulses are applied to an amplifier circuit which applies amplified pulses produced thereby to a diode through which they are coupled to an output lead. The output lead is coupled through a voltage breakdown device, which for purposes of illustration only is taken to be a Zener diode, to a capacitor shunted by a resistor. The values of the resistor and capacitor are such as to establish a time constant which is large compared with the frequency of the incoming pulses. The junction of the Zener diode and the capacitor is connected to a gain control circuit of the amplifying device so that variations of the voltage on the capacitor vary the gain of the amplifying device.

The operation of the circuit is such that upon an output voltage pulse of an amplitude greater than the breakdown voltage of the Zener diode being applied to the series-connected diode, a segment of the pulse of lesser amplitude than the breakdown voltage of the Zener diode appears as an output pulse while the segment of the pulse exceeding the breakdown voltage is applied to the capacitor to charge it. The charge on the capacitor decreases the gain of the amplifying device and at the same time applies a reverse bias across the series-connected diode. In consequence, the next pulse produced by the amplifier is reduced in amplitude and then is sliced, that is, the bottom portion of the pulse, is prevented from passing through the diode to the output lead. The pulse now appearing on the output lead is therefore reduced in amplitude as the result of the reverse bias on the diode and the reduction in gain of the amplifying device. Stability of the circuit is achieved when the voltage applied to the output lead is larger than the threshold voltage of the Zener diode by an amount equal to the voltage required to apply a charge to the capacitor substantially equal to the loss of charge by the capacitor between pulses. Under these conditions, the charge on the capacitor remains constant, the gain of the amplifying device is constant and the reverse bias on the series-connected diode is constant. Thus, all variable circuit parameters become fixed and circuit stability is maintained so long as the amplitude of the incoming pulses are constant.

If the voltage of the input pulses to the circuit decreases in amplitude, initially the amplitude of the voltage appearing on the output lead is insufficient to continue charging of the capacitor and therefore the gain of the amplifying device increases and the reverse bias on the diode between the amplifying device and the output lead decreases. These two effects combine to increase the amplitude of the pulse appearing on the output lead and effect compensation of the circuit so that the pulses rapidly are increased in amplitude to that required to maintain the charge on the capacitor constant.

The circuit of the invention has two effects upon the amplified pulses; the Zener diode, or any other non-linear, unilateral conducting device which may be employed similarly, limits the amplitude of the output pulse to the break-down voltage of the apparatus and therefore maintains the pulses at a constant amplitude, and the series connected diode removes the bottom and therefore, the noisiest segment of the amplified pulses. Consequently, the pulses applied to the output lead are relatively noise free and are of substantially constant amplitude. Although some noise signals may still be transmitted through the circuit of the invention, the cleanest portion of the applied pulse has been utilized and remaining noise signals may be further reduced by amplitude discrimination in subsequent stages of the apparatus in which the circuit is utilized.

It is an object of the present invention to provide an automatic pulse amplitude control circuit which maintains the amplitude of an output pulse constant and which improves the signal-to-noise ratio of the output pulse with respect to the signal-to-noise ratio of the corresponding input pulse.

It is another object of the present invention to provide an amplitude control circuit to maintain the amplitude of the pulses on the output lead of the circuit at a substantially constant value.

It is yet another object of the present invention to provide a combined clipping and slicing circuit wherein the slicer removes the lower segment of a pulse so as to remove the noisiest portion thereof and the clipper removes the upper portion of a voltage pulse to maintain its amplitude constant.

Figure 2:
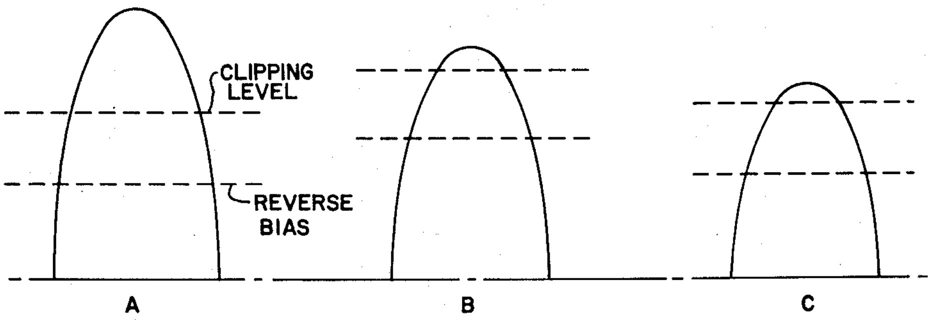
Figure 3:
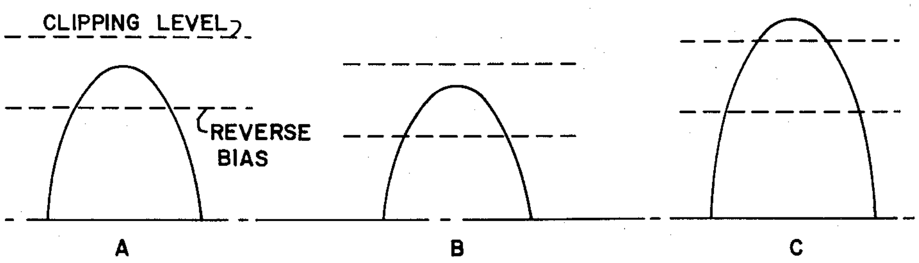

The above and still further objects, features and advantages of the present invention will become apparent upon consideration of the following detailed description of one specific embodiment thereof, especially when taken in conjunction with the accompanying drawings, wherein:

FIGURE 1 is a schematic circuit diagram of an embodiment of the present invention; and FIGURES 2 and 3 are graphs employed to illustrate the operation of the invention.

Referring specifically to FIGURE 1 of the accompanyig drawings, pulses are applied between a first input terminal 1 and a second input terminal 2 which is connected to a source of reference potential hereinafter referred to as ground for purposes of illustration only. The input terminal 1 is coupled through a coupling capacitor 3 to a grid 4 of a triode 6 having a cathode 7 and an anode 8. The cathode 7 of the triode 6 is connected to ground through a bias resistor 9 while the anode 8 is connected through a resistor 11 to a source of anode potential. The anode 8 of the tube 6 is further connected through a coupling capacitor 12 to the cathode of a diode 13. The cathode of the diode 13 is connected through a resistor 15 to ground, while the anode of the diode 13 is connected to a lead 14 which is coupled through a coupling capacitor 16 to a first output terminal 17. A second output terminal 18 is connected to ground.

The lead 14 is further connected through a Zener diode 19 to a junction 21. The junction 21 is connected to ground through a resistor 22 and a capacitor 23 connected in parallel, the time constant of the resistor 22 and capacitor 23 being long compared to the rate at which pulses are applied to the input terminals 1 and 2. The junction 21 is also connected via a feed-back lead 24 to a resistor 26 and through the resistor 26 to the grid 4 of the tube 6.

At the initiation of operation of the circuit the capacitor 23 is discharged and therefore the grid 4 of the tube 6 is substantially at ground potential. Excessive conduction through the tube under these conditions is prevented by the cathode resistor 9 which develops a positive potential on the cathode 7 and therefore effectively biases the grid 4 negative and serves to limit the conduction through the tube 6. Upon the appearance of a positive pulse between the input terminals 1 and 2 a relatively large negative pulse appears at the anode 8 of the tube 6 and is coupled through the capacitor 12 to the cathode of the diode 13. The pulse appearing at the cathode of the diode 13 is passed substantially in its entirety through the diode to the lead 14. That portion of the pulse appearing on the lead 14 which does not exceed the break-down voltage of the Zener diode 19 is coupled through the capacitor 16 and appears across the output terminals 17 and 18 of the circuit. That portion of the pulse on the lead 14 which exceeds the break-down voltage of the diode 19 passes therethrough and charges the capacitor 23 negatively with respect to ground.

The negative charge on the capacitor 23 is coupled via lead 24 and resistor 26 to the grid 4 of the tube 6, and increases the negative bias on the tube in order to reduce its gain. Therefore, the second pulse appearing at the anode 8 of the tube 6, assuming that the amplitude of the pulses applied between terminals 1 and 2 remains constant, is reduced, and the amplitude of the pulse applied to the cathode of the diode 13 is less than that of the first pulse applied thereto. The voltage appearing across the capacitor 23 not only reduces the gain of the tube 6 but is also applied through the Zener diode 19 to the lead 14 and therefore represents a reverse bias on the diode 13. In consequence, only that portion of the pulse that exceeds the reverse bias across the diode 13 is applied to the lead 14. Thus, the amplitude of the pulse appearing on the lead 14 in response to the second pulse applied to the circuit is reduced as a result of reduction of the gain of the tube 6 and as a result of the reverse bias on the diode 13.

The pulse on the lead 14 now exceeds the break-down voltage of the diode 19 by a lesser amount than the first pulse and the voltage applied to the capacitor 23 in response to the second pulse is less than that applied thereto by the first pulse. The voltage coupled through the capacitor 16 to the output lead 17, however, is still equal to the break-down voltage of the diode 19 and therefore even though the amplitudes of the voltage pulses appearing on the lead 14 in response to successive input pulses is gradually reduced, the amplitude of the pulses appearing across the output terminals remains the same. The further increase in voltage across the capacitor 23 further reduces the gain of the tube 6 and at the same time increases the reverse bias across the diode 13. This process of increasing the charge on the capacitor 23 continues until the charge on the capacitor 23 is such that the voltage applied thereto in response to each incoming pulse exactly equals the leakage of charge from the capacitor during each interval between pulses. Under these conditions, the charge on the capacitor 23 remains constant and the circuit is stabilized so long as the amplitude of the incoming pulses is not altered.

As an example of a specific circuit, it is assumed that the breakdown voltage of the Zener diode 19 is 9 volts and the circuit stabilizes when the voltage on the capacitor is 12 volts. Under these circumstances, the circuit stabilizes when the amplitude of the pulses applied to the cathode of the diode 13 is slightly greater than 21 volts, the voltage on the capacitor 23 is 12 volts and the reverse bias across the diode 13 is 12 volts. The voltage appearing on the lead 14 is as a result slightly greater than 9 volts and the small segment of the voltage exceeding 9 volts maintains the charge on the capacitor 23, while a 9 volt pulse is coupled through the capacitor 16 to the output terminal 17. If for any reason the amplitude of the incoming pulses increases, and reference is now made to the graphs A—C of FIGURE 2 of the accompanying drawings, the voltage on the lead 14 increases while, initially, the voltage across the capacitor remains at 12 volts (see graph A of FIGURE 2). The portion of the signal exceeding 21 volts (12 volts reverse bias on diode 13 and 9 volts across Zener diode 19) is applied to capacitor 23 and the charge on the capacitor 23 is increased at a rate depending upon the time constant of the circuit (see graph B). As a result of the charge applied to the condenser 23, the gain of the tube 6 is decreased while the reverse bias on the diode 13 is increased. Thus, the amplitude of the pulse on the cathode of diode 13 is decreased while the reverse bias across the diode is increased and the amplitude of the pulse on lead 14 is greatly reduced. The capacitor is again charged by the portion of the pulse lying above the clipping level of diode 19 and the gain of the tube 6 is further reduced. The circuit again stabilizes when the amplitude of the pulses on lead 14 exceeds 9 volts by such a value that the rate of charging of the capacitor 23 equals its rate of discharging between pulses (see graph C).

If the amplitude of the incoming pulses applied between terminals 1 and 2 decreases, (see graph A of FIGURE 3 of the accompanying drawings) the charge on capacitor 23 gradually decreases (see graph B) and the gain of the tube 6 increases. Also, the reverse bias across the diode 13 decreases and the amplitude of the pulses on the lead 14 increases. The system again stabilizes when the rate of charging of the capacitor 23 substantially equals its rate of discharge.

It will be noted that in consequence of the operation of the circuit, the 9 volt pulse applied across the output terminals 17 and 18 constitutes the upper 9 volts of the amplified pulse appearing at the anode of the tube 6. Referring again to FIGURES 2 and 3, graph C, the portion of the pulse applied between the output terminals 17 and 18 is the 9 volt portion of the pulse immediately adjacent the top of the amplified pulse. The ratio of the output voltage to the voltage of the amplified pulse on the anode 8 of tube 6 is a function of the break-down voltage of the diode 19 and the voltage required across capacitor 23 to stabilize the circuit. This latter voltage is in turn a function of the tube characteristics and the value of the resistors 9 and 11, the former determining the no signal bias on the grid 4 and the latter determining the gain characteristics of the amplifier circuit. By properly proportioning the resistors 9 and 11 the aforesaid ratio may be altered so that in the presence of serious noise the ratio may be decreased while maintaining the amplitude of the output pulse unchanged.

It will be noted that the rejection of the lower portion of the pulse; that is, the lower 12 volts of the pulse in the specific example given, eliminates a large portion of the noise and clutter which would otherwise be gated to the output terminals and which might produce spurious operation of counting or control equipment. Further, where the pulses are received from circuits which tend to go into damped oscillation and it is desired to respond to only the first peaks of the wave, the circuit of the invention passes, depending upon the characteristics of the oscillatory circuit, only the first peak, or substantially smaller secondary peaks which may be easily eliminated by subsequent amplitude descrimination. Regardless, however, of the nature or source of interfering signals, the circuit of the invention passes only an uppermost portion of the pulse and effects a substantial gain in the signal-to-noise ratio of any pulse circuit in which it is employed in addition to its function of stabilizing the amplitude of the output pulses.

The invention is not restricted to the specific circuit illustrated and it is apparent that any of the well known amplifying devices, such as transistors, saturable transformers, etc., may be employed in place of the tube 6, while other types of non-linear unilateral conduction elements may be employed in place of the Zener diode 19. Reverse biased diodes and neon tubes are examples of such elements. Further the circuit may be employed with negative input pulses by reversing the diode connections and inserting a phase inverter in the lead 24.

While I have described and illustrated one specific embodiment of my invention, it will be clear that variations of the details of construction which are specifically illustrated and described may be resorted to without departing from the true spirit and scope of the invention as defined in the appended claims.

What I claim is:

1. In a system for receiving an input signal composed substantially of information pulses, said system including a first lead and a second lead, and signal means responsive to said input signal for developing a pulse-type output signal on said first lead, the improvement in combination therewith of an amplitude-stabilizing and noise-eliminating circuit comprising a diode interconnected in the manner of a couple between said first and second leads and poled to pass only pulses of a first polarity, a conducting device interconnected with said second lead and adapted to pass substantially only pulses of said first polarity above a predetermined threshold and substantially all pulses of a second opposite polarity, and a capacitor adapted and arranged between said device and said signal means in a manner to inversely vary the absolute amplitude of said output signal on said first lead in accordance with the voltage developed on said capacitor by the pulses passed by said device.

2. In a system for receiving an input signal composed substantially of information pulses, said system including a first lead and a second lead, and signal means arranged and adapted to respond to said input signal in a manner to develop an output signal on said first lead composed substantially of pulses functionally related to said information pulses, the improvement in combination therewith of an amplitude-stabilizing and noise-eliminating circuit comprising a diode interconnecting said first lead to said second lead and poled to pass only pulses of a first polarity, a Zener diode connected to said second lead and adapted and poled to pass substantially only pulses of said first polarity above a pre-determined threshold and substantially all pulses of a second opposite polarity, and a capacitor interconnected with the input of said signal means and said Zener diode in a manner such that a voltage is developed thereupon by pulses of a first polarity passed by said Zener diode and such that the absolute amplitude of said output signal pulses is varied inversely in accordance with said voltage.

3. In a system for receiving an input signal composed substantially of information pulses, said system comprising a first lead and second lead, and an amplifier arranged and adapted to develop an output signal on said first lead composed substantially of pulses functionally related to said information pulses, the improvement in combination therewith of an amplitude-stabilizing and noise-eliminating circuit comprising a diode arranged to couple pulses between said first and second leads and poled to pass substantially only pulses of a desired polarity, a conducting device connected to said second lead and adapted to freely pass substantially all received pulses of a polarity opposite said desired polarity and to pass substantially only those pulses of said desired polarity above a pre-determined threshold, and a capacitor arranged and adapted to be charged by pulses of said desired polarity passed by said device and further arranged and adapted to inversely vary the amplitude of said output signal inversely of the absolute voltage on said capacitor.

References Cited in the file of this patent

UNITED STATES PATENTS

| | | |
|---|---|---|
| 2,265,883 | Applegarth | Dec. 9, 1941 |
| 2,338,412 | Dallos | Jan. 4, 1944 |
| 2,353,018 | Duke | July 4, 1944 |
| 2,537,958 | Berman | Jan. 16, 1951 |
| 2,719,191 | Hermes | Sept. 27, 1955 |
| 2,791,739 | Light | May 7, 1957 |
| 2,801,300 | Crane et al. | July 30, 1957 |
| 2,850,627 | Moore et al. | Sept. 2, 1958 |
| 2,857,481 | Philips | Oct. 21, 1958 |
| 2,916,702 | Bigelow | Dec. 8, 1959 |

OTHER REFERENCES

"Instantaneous Speech Compressor" by Rutherford, Electronics, February 1, 1957, pages 168–169.